United States Patent
Sieg

(10) Patent No.: US 10,670,643 B2
(45) Date of Patent: Jun. 2, 2020

(54) METHOD FOR EVALUATING A CAPACITY VALUE OF A CAPACITIVE SENSOR ELECTRODE

(71) Applicant: Berthold Sieg, Bottrop (DE)

(72) Inventor: Berthold Sieg, Bottrop (DE)

(73) Assignee: Huf Huelsbeck & Fuerst GmbH & Co. KG, Velbert (DE)

( * ) Notice: Subject to any disclaimer, the term of this patent is extended or adjusted under 35 U.S.C. 154(b) by 109 days.

(21) Appl. No.: 16/155,363

(22) Filed: Oct. 9, 2018

(65) Prior Publication Data

US 2019/0113554 A1 Apr. 18, 2019

(30) Foreign Application Priority Data

Oct. 18, 2017 (DE) .................. 10 2017 124 309

(51) Int. Cl.
*G01R 27/26* (2006.01)
*H03K 17/955* (2006.01)

(52) U.S. Cl.
CPC ....... *G01R 27/2605* (2013.01); *H03K 17/955* (2013.01); *H03K 2217/960705* (2013.01); *H03K 2217/960725* (2013.01)

(58) Field of Classification Search
CPC ........ G01R 27/00; G01R 27/02; G01R 27/26; G01R 27/2605; H03K 17/00; H03K 17/94;
(Continued)

(56) References Cited

U.S. PATENT DOCUMENTS 5,730,165 A * 3/1998 Philipp .................. E03C 1/057
 137/1
5,973,417 A * 10/1999 Goetz .................. H03K 17/962
 307/116
(Continued)

FOREIGN PATENT DOCUMENTS

DE 297 21 213 U1 1/1998
DE 196 81 725 B4 4/2007
(Continued)

OTHER PUBLICATIONS

European Search Report of British Application No. 18186279 dated Feb. 5, 2019, 8 pages.

*Primary Examiner* — Hoai-An D. Nguyen
(74) *Attorney, Agent, or Firm* — Fay Sharpe LLP

(57) ABSTRACT

A method for evaluating a capacity value of a capacitive sensor electrode includes an evaluation process, which includes performing a charging process of a sensor electrode, and evaluating a parameter, which depends on the capacity value of the sensor electrode. A first charging pulse duration $t_{L,1}$ for the charging process includes a first coupling duration $t_{K,1}$ and a first decoupling duration $t_{E,1}$ with $t_{L,1}=t_{K,1}+t_{E,1}$, of a first coupling and decoupling cycle. A second charging pulse duration $t_{L,2}$, includes a second coupling duration $t_{K,2}$ and a second decoupling duration $t_{E,2}$ with $t_{L,2}=t_{K,2}+t_{E,2}$, of a second coupling and decoupling cycle immediately following the first coupling and decoupling cycle. These differ from each other by a first pulse duration difference $\Delta t_{L,1}$.

19 Claims, 3 Drawing Sheets

(58) Field of Classification Search
CPC ............... H03K 17/945; H03K 17/955; H03K 2217/9607; H03K 2217/960705; H03K 2217/96071; H03K 2217/960725; G01D 5/24; G06F 3/044
USPC ........ 324/600, 649, 658, 676, 678; 361/139, 361/143, 152, 154, 155, 156, 225, 226; 345/173, 174
See application file for complete search history.

(56) References Cited

U.S. PATENT DOCUMENTS

| | | | | |
|---|---|---|---|---|
| 2010/0219845 | A1* | 9/2010 | Easter ................ | G01R 27/2605 324/678 |
| 2011/0221452 | A1* | 9/2011 | Shyue ................. | H03K 17/962 324/658 |
| 2013/0321006 | A1* | 12/2013 | Weingaertner ...... | B60R 25/2054 324/679 |
| 2015/0316680 | A1* | 11/2015 | Sieg ........................ | G01B 7/14 324/686 |

FOREIGN PATENT DOCUMENTS

| | | |
|---|---|---|
| DE | 10 2012 224 037 A1 | 6/2014 |
| DE | 10 2013 112 910 A1 | 6/2014 |
| WO | WO 2016/061429 A1 | 4/2016 |

\* cited by examiner

METHOD FOR EVALUATING A CAPACITY VALUE OF A CAPACITIVE SENSOR ELECTRODE

BACKGROUND

The invention refers to a method for evaluating a capacity value of a capacitive sensor electrode.

The use of capacitive sensor electrodes is known in practice for various applications.

An example of the use of capacitive sensor electrodes are capacitive proximity switches, which are mounted on vehicles, in order to detect the presence of a person, for example. The function of such a capacitive proximity sensor is based on the fact that the capacity of a capacitive sensor electrode of the proximity sensor reaches a certain value or exceeds the same or experiences a predetermined absolute or relative change.

In order to evaluate the capacity at a certain time or during a specific time interval, the capacitive sensor electrode is coupled to a predetermined potential. The sensor electrode forms a capacity with a reference electrode. The reference electrode, in the example of a proximity sensor on a vehicle, may be a vehicle ground or a ground of the terrain under the vehicle. If a body part of a user, such as a hand or a foot, enters the sensitive area of the sensor electrode, the electrostatic properties of the entire system are changed. In the context of an equivalent observation, this effect may be considered as a change of the dielectric, which surrounds the sensor electrode.

In order to derive, from the capacity value of the sensor electrode or from the change of the capacity value of the sensor electrode, a piece of information such as a piece of information regarding the presence of a hand or a foot, an evaluation of the capacity value is required.

The evaluation of the capacity value may occur in different ways. For example, a repeated charging of the sensor electrode to a reference potential of a voltage source and discharging of the sensor electrode into a comparative capacity and after the repeated charging and discharging, an evaluation of the charge accumulated on the comparative capacity may be performed. An example of such an implementation of this concept is shown in DE 196 81 725 B4.

Fundamentally, in order to evaluate the capacity value, the principle is used, according to which the sensor electrode is periodically charged and, after the periodic charging, a capacity dependent parameter, either of the charging process or of the discharging process, which is generally also periodically performed, is evaluated.

The parameter to be evaluated may be a voltage, for example, which is measured over a capacitor collecting a charge, such as the one described in the previous document.

Another possible parameter to be evaluated may be a number of charging and discharging cycles until a switch threshold on a compensation capacitor is exceeded. An example of such a procedure is provided in DE 10 2013 112 910 A1. In the method described in this publication, during a first phase, the capacitive sensor electrode is coupled via a first switching device to a charging voltage, in order to charge the sensor electrode. At the same time, a compensation capacity is introduced by means of a further second switching device between a reference voltage and the ground, whereby the compensation capacity is also provided with a charge. Thereafter a charge compensation between sensor electrode and compensation capacity is performed. The determination of the electrode capacity occurs based on an evaluation of the charge accumulated on the compensation capacity.

It is thus to be noted that methods known in the art and from practical use, for evaluating the capacity value of a capacitive sensor electrode, require that the sensor electrode is cyclically charged. Depending on the concrete embodiment, the sensor electrode may be charged stepwise in a plurality of cycles, or the sensor electrode in each cycle of a plurality of cycles, may be both charged—partially or completely—and discharged—partially or completely.

In order to ensure a reliable evaluation of the capacity of the sensor electrode in a sufficiently short time, the cyclical charging and possibly also the discharging of the sensor electrode occur generally at relatively high frequencies. Frequencies are often in the range from some 10 kHz to several 100 kHz.

Due to the high-frequency charging of the sensor electrode, the problem arises—tendentially more pronounced at higher frequencies—that due to the high-frequency cyclical charging and possible discharging, undesired alternate electromagnetic fields are generated. Depending on the size and shape of the sensor electrode, the circuital implementation of the control of the sensor electrode and of the selected frequency, the sensor electrode correspondingly behaves as an antenna and irradiates electromagnetic radiation. This effect may be particularly problematic due to the fact that products irradiating electromagnetic waves are subject to normative limitations. For example, in the Federal Republic of Germany, limitations based on the federal transmission protection law are in effect, according to which compulsory limits for electromagnetic radiations may be derived. The corresponding limiting values are frequency-dependent and relatively tight. The frequency used for evaluating sensor electrodes, as said, which are typically relatively high, on one hand, and the strict normative requirements, on the other hand, set high requirements for the construction and the operation of capacitive sensor electrodes.

Based on these background observations, the object of the invention is to allow the evaluation of a capacitive value of a capacitive sensor electrode and the arrangement of a capacitive sensor electrode, such as on a motor vehicle, with improved flexibility, for example with regards to configuration and mounting site.

BRIEF SUMMARY

This object is achieved by a method with the characteristics of claim 1.

Advantageous developments are provided in the dependent claims.

The method is used for evaluating a capacitive value of a capacitive sensor electrode. In order to evaluate the capacity, at least a cyclical charging of the sensor electrode is performed. The cyclical charging of the sensor electrode comprises the fact that the sensor electrode is subject to a number of coupling and decoupling cycles. In the course of each of the coupling and decoupling cycles, the sensor electrode is coupled to a charging circuit for a coupling duration $t_K$. During the coupling of the sensor electrode with the charging circuit, the sensor electrode is partially or completely filled with an electric charge. The quantity of charge absorbed by the capacitive electrode depends on the capacity, according to the relationship $C=Q/U$, where C=capacity, Q=charge quantity, U=electric voltage. After the coupling duration $t_K$ the sensor electrode is decoupled from the charging circuit during a decoupling duration $t_E$.

During the coupling duration $t_K$ at least a partial charging of the sensor electrode takes place. During the decoupling duration $t_E$ no charging of the sensor electrode takes place. In principle, during the coupling duration $t_K$ a complete charging of the sensor electrode may also take place. During the decoupling duration $t_E$ not only charging may be absent, but also a partial or complete discharging of the sensor electrode may be provided. For the concrete implementation of charging of the sensor electrode, from a circuit point of view, various implementations are known to those skilled in the art. Also the implementation decision, whether during the decoupling duration $t_E$ only the charging has to be interrupted or also a discharging of the sensor electrode is foreseen, such as by coupling the sensor electrode to an evaluation circuit and/or by transferring a charge on the sensor electrode to a compensation capacitor, depends from the respective selection of the evaluation method by those skilled in the art and its concrete implementation by those skilled in art.

A circuit has to be conceived, according to those skilled in the art, as a group of electronic components which are connected to each other. A circuit in the context of the present application is thus a synonym of an electric circuit wherein each kind of electric circuit may be used in order to put the invention into practice. In special embodiments of the invention, the concept of an electric circuit may also refer to integrated circuits, whereby embodiments of the invention are possible, in which one or more of the circuits is or are integrated circuits, respectively.

Regardless of the concrete implementation of the evaluation of the capacity of the sensor electrode, an essential prerequisite for performing the inventive method is that a cyclical charging or a cyclical sequential charging of the sensor electrode takes place.

The inventive method comprises the step in which a parameter dependent on the capacity value of the sensor electrode is evaluated. The evaluation of the parameter dependent on the capacity value of the sensor electrode may in particular occur in each coupling and decoupling cycle, in more than one but not all coupling and decoupling cycles, or only after finishing all coupling and decoupling cycles.

The parameter used for evaluating the capacity value may be for example the voltage curve at a terminal of the sensor electrode, a voltage measured on a capacitor which is collecting charge or a certain number of periods of charge and/or discharge until a switch threshold is exceeded by a voltage measured on the sensor electrode.

Said steps of the inventive method of coupling the sensor electrode with the charging circuit and of decoupling the sensor electrode from the charging circuit and the determination of the capacity value or a comparative variable representing the capacity value are known to those skilled in the art, such as from previous documents.

Contrary to procedures known in practice, the inventive method is different in that within an evaluation process, a plurality of coupling and decoupling cycles are performed and that the duration of the coupling and decoupling cycles within the evaluation process is changed. In other words, the pulse frequency of the coupling and decoupling durations during an evaluation process is variable.

In other words, at least a first charging pulse duration $t_{L,1}$ and a second charging pulse duration $t_{L,2}$ are provided. The first charging pulse duration is composed of the sum of a first coupling duration $t_{K,1}$ and a first decoupling duration $t_{E,1}$. The second charging pulse duration $t_{L,2}$ is composed of the sum of a second coupling duration $t_{K,2}$ and a second decoupling duration $t_{E,2}$.

As used herein, the first and second charging pulse durations are charging pulse durations of a first coupling and decoupling cycle and of a second coupling and decoupling cycle, which are immediately successive. However, it is not necessary that these are the first two coupling and decoupling cycles of an evaluation process, but these may be immediately successive coupling and decoupling cycles which are positioned in any position of a sequence of coupling and decoupling cycles of an evaluation process.

The first charging pulse duration and the second charging pulse duration differ according to the invention with regard to their length. The first charging pulse duration differs from the second charging pulse duration by a first pulse duration difference $\Delta t_{L,1}$. In mathematical terms, the pulse duration difference fulfils the equation $\Delta t_{L,1} = t_{L,2} - t_{L,1}$.

Due to the fact that the inventive variation of the charging pulse durations used within an evaluation process is implemented, the radiation characteristic of the sensor electrode during the evaluation of its capacity is advantageously influenced. Due to the variation of the charging pulse durations, the maximum values of the frequency-dependent irradiation power density are reduced, in favor of a broadening of the bandwidth of the signal spectrum. The frequency-dependent irradiation peaks are thus spread and their height is reduced. In other words, a wider distribution of the irradiation energy density on irradiation frequencies is obtained. Moreover, the irradiation of harmonics is avoided or at least their severity is reduced.

Therefore, the invention is based on the finding, that in capacitive sensor electrodes in known and usual evaluation methods, the charging of the sensor electrode may cause problematic effects, if it is performed with an excessive charging frequency. By varying the charging frequency these effects are reduced or even prevented. The inventive procedure allows a more flexible configuration of the sensor electrode and of the implementation of the capacity evaluation in the context of the boundary conditions required by said norms, for example. Due to the fact that the frequency-dependent energy density has a wider distribution over the frequency scale, and the amplitude maxima are smaller, in total higher frequencies may be used for evaluation. This is also connected to the advantage that the evaluation speed may be increased. A considerable advantage of the inventive solution is that the variation of the charging pulse durations may be obtained by corresponding control, such as of the charging circuit or in general of a corresponding evaluation circuit. The implementation of the inventive method may thus be obtained by corresponding adaptation of a control electronics and thus optionally by means of a purely software-like adaptation. Correspondingly, if desired, existing hardware may also be used, whereby an additional cost reduction may be achieved.

It is preferred, if an evaluation process is carried out with a number of coupling and decoupling cycles, which is between 100 and 500, in particular preferably between 150 and 250.

In particular, according to an advantageous embodiment, the first charging pulse duration and the second charging pulse duration are between 1.0 μs and 10.0 μs, preferably between 2.5 μs and 4.0 μs. With the obtained coupling and decoupling frequencies between 250 and 400 kHz, reliable results are usually achieved within very short times.

Preferably, all charging pulse durations, i.e. all coupling and decoupling cycles, of the evaluation process are between 1.0 μs and 10.0 μs, preferably between 2.5 μs and 4.0 μs.

According to an alternative, the pulse duration difference $\Delta t_{L,1}$ may be set by varying the decoupling duration, i.e. the first charging pulse duration $t_{L,1}$ and the second charging pulse duration $t_{L,2}$ differ only in their decoupling duration, wherein the coupling duration is maintained, and is identical for both the first and second coupling and decoupling cycles.

In another alternative procedure, the change of the charging pulse duration between the first coupling and decoupling cycle and the second coupling and decoupling cycle is set by changing the coupling duration while maintaining the decoupling duration.

Another alternative contemplates a mixed embodiment of both preceding alternatives, in that the pulse duration difference $\Delta t_{L,1}$ is obtained both by changing the coupling duration and by changing the decoupling duration.

For the variations of the charging pulse durations, within an evaluation process, with a number of N coupling and decoupling cycles, which may be continuously indexed with an integer index i from 0 to N−1, it may be provided that the pulse duration difference $\Delta t_{L,i}$ between two charging pulse durations $t_{L,i+1}$ and $t_{L,i}$ of two subsequent coupling and decoupling cycles having index numbers i and i+1, for at least 50% of the coupling and decoupling cycles, corresponds to a relative difference between the modulus of the charging pulse duration of $|\Delta t_{L,i}|/t_{L,i} \geq 0.1$. In other words, it is contemplated that in at least 50% of the coupling and decoupling cycles, a pulse duration difference with respect to the immediately preceding coupling and decoupling cycle is provided, and that this pulse duration difference changes the respectively immediately preceding charging pulse duration by at least 10%. In preferred embodiments, such a change is not only at 50%, but at least 80%, in a particularly preferred procedure even equal to 100% of all coupling and decoupling cycles of an evaluation process.

In a development of the method, a minimum charging pulse duration and a maximum charging pulse duration and the number of predetermined charging pulse duration values are preset. Two successive coupling and decoupling cycles are activated with two different values of the predetermined charging pulse duration values. It is thus contemplated that the charging pulse duration control is not random or that no calculation of coupling and/or decoupling durations is performed, but that, a list with at least two charging pulse duration values, preferably formed by pairs of coupling and decoupling durations, is provided on a microcontroller controlling the method, for example, and based on this list, the variation of the charging pulse duration is controlled.

In particular, the preset charging pulse duration values may be distributed at equal distances from each other between the minimum and the maximum charging pulse duration. A minimum and a maximum charging pulse duration are preset, for example, which are both between 1.0 µs and 10 µs, and that between the minimum and maximum charging pulse duration a number of equidistant charging pulse duration values are provided. The minimum charging pulse duration is preferably 1.5 µs and the maximum charging pulse duration is 5.0 µs, in particular preferably a minimum charging pulse duration of 2.0 µs and a maximum charging pulse duration of 4.0 µs. The charging pulse durations may be directly set or by combining corresponding coupling and decoupling durations.

The charging pulse durations may be used in a predetermined sequence or in a random sequence for controlling the charging circuit.

As an alternative, the variation of the charging pulse durations may also occur by presetting a maximum charging frequency and a minimum charging frequency. A number of predetermined charging pulse frequencies may be provided, wherein two successive coupling and decoupling cycles are controlled with two different frequencies of the predetermined charging pulse frequencies. In particular, the charging pulse frequencies may be distributed at equal distances from each other between the maximum charging frequency and the minimum charging frequency. The charging pulse frequencies may be selected in a predetermined sequence or in random succession. In principle, it is the same procedure as in the direct selection of preset charging pulse durations, depending on the implementation, the selection of the charging pulse frequencies reciprocal to the charging pulse durations may be more elegant in its implementation. In analogy to above said preferred charging pulse durations, the minimum charging frequency and the maximum charging frequency may be between 1000 kHz and 100 kHz, preferably between 667 kHz and 200 kHz, and particularly preferably between 400 and 250 kHz.

An exemplary process sequence for performing the inventive method comprises the performing of following steps:

in the coupling and decoupling cycle, during the coupling duration $t_K$ the sensor electrode is completely charged with a predetermined charging voltage of the charging circuit, during the decoupling duration $t_E$ after the decoupling of the sensor electrode from the charging circuit, a coupling of the sensor electrode with a storage circuit takes place. The storage circuit has a storage capacity $C_L$. Due to the coupling of the sensor electrode with the storage circuit, a transfer of charge carriers stored in the sensor electrode to the storage capacity $C_L$ occurs.

In the plurality of coupling and decoupling cycles, the sensor electrode in each coupling cycle during the coupling duration is again completely charged. The storage capacity $C_L$ is subsequently, not necessarily completely, charged with charge carriers, during the successive decoupling durations, with the charge of the charged sensor electrode.

The evaluation of the parameter depending on the capacity value of the sensor electrode comprises detecting, after a number of multiple coupling and decoupling cycles, preferably a predetermined number of coupling and decoupling cycles, a voltage on the storage capacity and using the same for determining the capacity of the sensor electrode or for determining a value, which depends on the capacity of the sensor electrode.

The evaluation is based in particular on the dependence, known to those skilled in the art, of the charge carrier transfer between two capacitors or capacities. Due to this relationship, after a number of transfer processes between the completely charged sensor electrode and the storage capacity, which is not charged or only partially charged, the capacity of the sensor electrode or a variable depending thereon may be inferred.

The exact execution pertains to those skilled in the art. Reasonably, $C_L$ is larger than the capacity of the sensor electrode, if no object is proximate. The capacity of $C_L$, for example, may be at least a multiple of the capacity of the sensor electrode, preferably according to a factor corresponding to or exceeding the predetermined number of coupling and decoupling cycles. Preferably, $C_L$ is completely discharged before the first coupling and decoupling cycle. Also, the value of the coupling and decoupling durations has to be chosen so that the finishing of the desired transfer is allowed. This is the case with the order of magnitudes of the charging pulse durations cited in the present application.

Essential to the invention, as already mentioned, is the multiple charging of the sensor electrode. Possible irradiation effects, in which the sensor electrode undesirably operates as an antenna, are prevented or reduced by the inventive difference between the second and the first charging pulse duration.

Another exemplary sequence of steps for performing the inventive method comprises:

In the coupling and decoupling cycle, a coupling of the sensor electrode with the storage circuit takes place. The storage circuit has a storage capacity $C_L$. The storage capacity $C_L$ is charged once before the first coupling and decoupling cycle at a predetermined charging voltage. The coupling of the sensor electrode with the storage circuit causes a charge compensation between the storage capacity and the sensor electrode.

During the decoupling duration $t_E$ the sensor electrode is completely discharged, for example by temporary connection with a ground potential.

In the multiple coupling and decoupling cycles, the sensor electrode in each coupling cycle is charged with charge of the storage capacity. Thus, the storage capacity is successively but not necessarily completely, discharged, in the successive coupling and decoupling cycles and due to the discharge of the sensor electrode, which is again performed during each decoupling duration $t_E$.

The evaluation of the parameter depending on the capacity value of the sensor electrode comprises detecting, after a number of multiple coupling and decoupling cycles, preferably a predetermined number of coupling and decoupling cycles, a voltage on the storage capacity and using the same for determining the capacity of the sensor electrode or for determining a value which is dependent on the capacity of the sensor electrode.

The precise execution is known to those skilled in the art. $C_L$ is reasonably larger than the capacity of the sensor electrode, if no object is proximate. The capacity of $C_L$, for example, may be at least a multiple of the capacity of the sensor electrode, preferably according to a factor corresponding to or exceeding the predetermined number of coupling and decoupling cycles. The value of coupling and decoupling durations has to be chosen in a way that is required for the transfer processes. This is possible at the orders of magnitude provided in the application for the charging pulse durations. The speed with which the voltage drops over the capacity $C_L$ due to the repeated discharging to the sensor electrode, depends, among other things, on the capacity of the sensor electrode, according to a relation which is known to those skilled in the art. This dependence is used in order to infer from the voltage measured over $C_L$, the capacity of the sensor electrode, or a value dependent thereon, such as a relative variation of the capacity of the sensor electrode.

Also, in this possible embodiment, a repeated charging of the sensor electrode takes place, whose potentially negative effects are reduced by the inventive variation of the charging pulse duration.

The use of one of the described methods is particularly preferable for evaluating a capacity or capacity change of a proximity switch of a motor vehicle comprising a sensor electrode.

BRIEF DESCRIPTION OF THE DRAWINGS

The following figures are only illustrative of the previously described invention and its developments. It is obvious that the previous characteristics as well as the following characteristics may be used not only in the combination indicated, but also in other combinations or individually.

In particular:

FIG. 1b shows a schematic representation of an irradiation characteristic of the sensor electrode during the charging process of FIG. 1a;

FIG. 2b shows a schematic representation of an irradiation characteristic of the sensor electrode during the charging process of FIG. 2a;

DETAILED DESCRIPTION

Figure 1A:
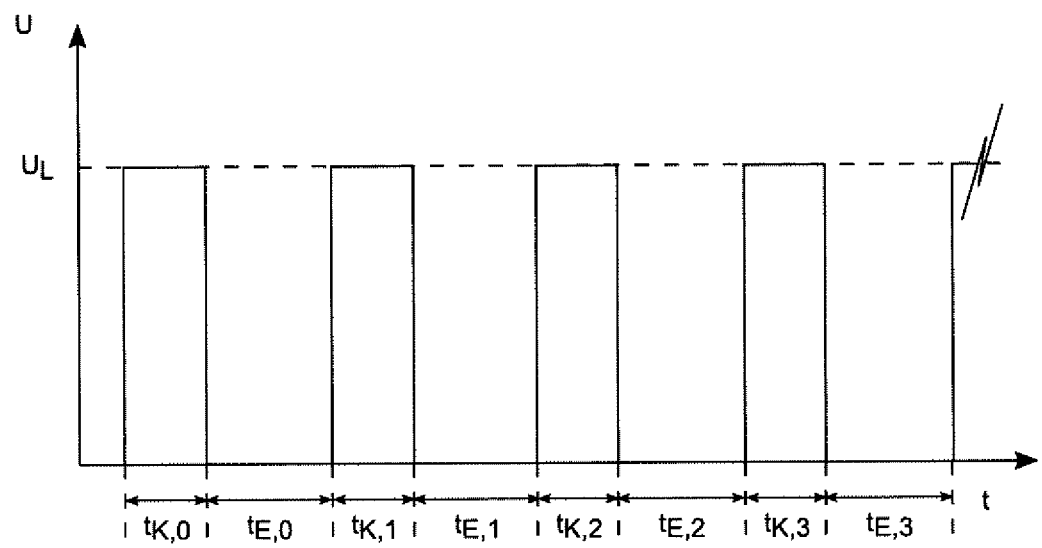
FIG. 1a shows a schematic representation of an exemplary charging process of the sensor electrode, which is known from practice.
Figure 1B:
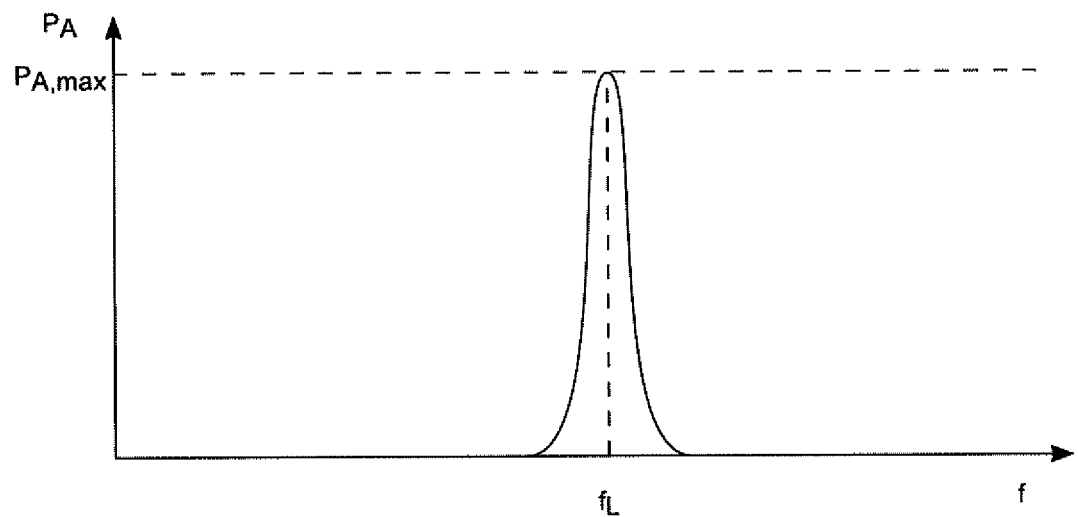

FIG. 1a shows a representation of coupling and decoupling durations during a portion of a charging process of a sensor electrode for evaluating its capacity. A voltage U, which is applied on the sensor electrode, is shown as a function of time t. As shown, a charging voltage $U_L$ is applied for a coupling duration $t_{K,i}$ on the sensor electrode, whereupon during a decoupling duration $t_{E,i}$ the charging potential is separated from the sensor electrode. The procedure is repeated for a number of coupling and decoupling cycles, wherein in FIG. 1a the coupling and decoupling cycles 1 to 4 are shown, with $t_{K,i}$ and $t_{E,i}$ for i=0 . . . 3. In the representation of FIG. 1a, $t_{K,1}=t_{K,2}=t_{K,3}=t_{K,4}=t_{K,i}$ for all i= 0 . . . N−1 of all N coupling and decoupling cycles of the evaluation process. In the same way, $t_{E,1}=t_{E,2}=t_{E,3}=t_{E,4}=t_{E,1}$ for all i=0 . . . N−1. From the control performed according to FIG. 1a of the coupling of the sensor electrode with the charging circuit, an irradiation characteristic of the sensor electrode is obtained, which is schematically shown in FIG. 1b. FIG. 1b shows an irradiation power $P_A$ as a function of a frequency f, wherein the maximum value of the irradiation characteristic is reached at the charging pulse frequency $f_L$, which is obtained from the charging pulse duration $t_i= t_{L,1}=t_{K,1}+t_{E,1}=1/f_L$.

Figure 2A:
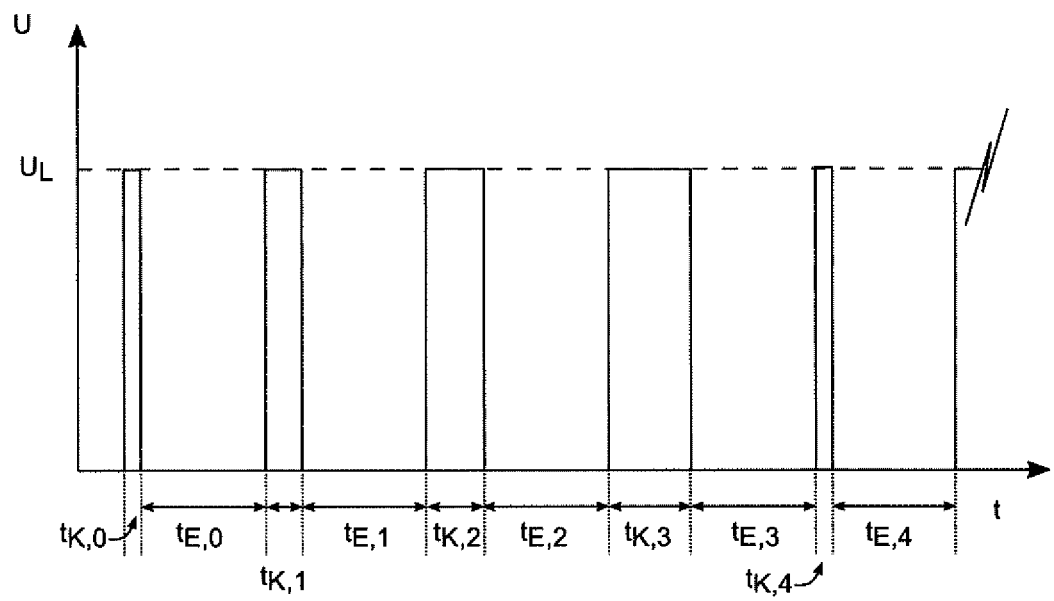
FIG. 2a shows a schematic representation of a charging process of the sensor electrode for the inventive evaluation of the capacity value of a sensor electrode.

The improved method according to the invention is shown in an exemplary variant in FIG. 2a. In the implementation of the method of FIG. 2a, the decoupling duration $t_{E,i}$ is unchanged for all i=0 . . . N−1; however, a change of the charging pulse duration occurs, in that the coupling duration is changed. In particular, the coupling duration $t_{K,0} \ne t_{K,1} \ne t_{K,2} \ne t_{K,3}$, wherein, in the figure shown, the decoupling duration remains constant at 2.5 μs for all coupling and decoupling cycles and the coupling duration is increased with equidistant steps of 0.5 μs from $t_{K,0}$=0.5 μs to $t_{K,3}$=2.0 μs. In the embodiment shown, with two successive coupling and decoupling cycles, a pulse duration difference of $\Delta t_{L,0}= \Delta t_{L,1}=\Delta t_{L,2}$=0.5 μs is introduced before, after reaching a coupling duration of 2.0 μs, in the immediately following coupling and decoupling cycle, a coupling duration of 0.5 μs is again provided, thus providing, in the examples shown, a modulus of the pulse duration difference of $|\Delta t_{L,3}|$=1.5 μs. The variation of the charging pulse durations occurs in the example shown according to a predetermined sequence, wherein the predetermined sequence entails the sequential increase of the coupling duration from a minimum to a maximum value, as shown and described, and thus the sequential and continuous increase of the charging pulse duration from the minimum to the maximum charging pulse duration. In principle, however, according to the above description, also another sequence of coupling durations may be possible within the scope of the invention.

Figure 2B:
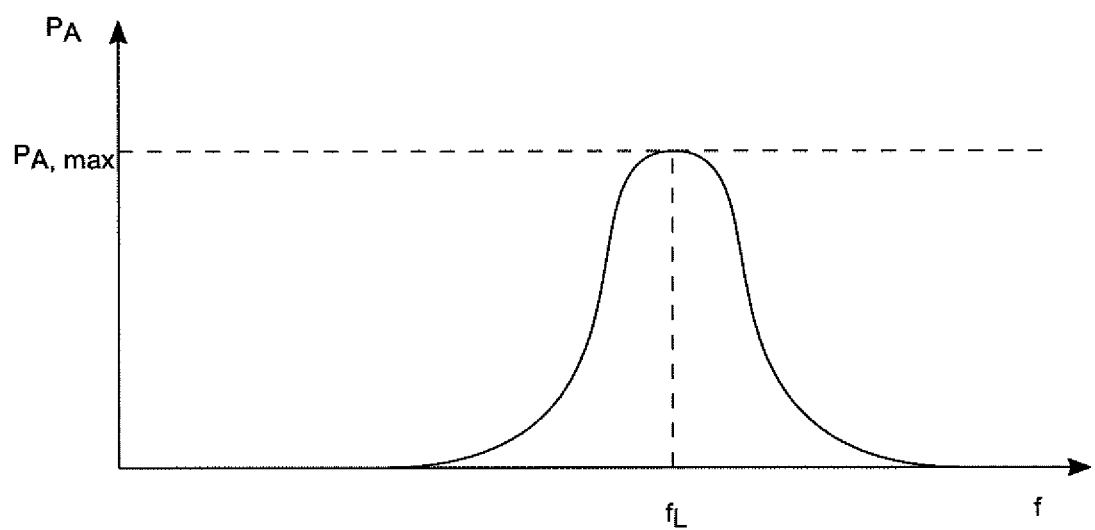

FIG. 2b shows an exemplary schematic representation of an irradiation characteristic of the sensor electrode during the charging process represented in FIG. 2a. In particular, the maximum irradiation power $P_{A,\,max}$ is significantly reduced with respect to the maximum value of the frequency-dependent irradiation power of FIG. 1b, while the half-value width of function $P_{A,\,max}$ with the characteristic shown in FIG. 2b is considerably widened with respect to the functional correlation of FIG. 1b.

Figure 3:
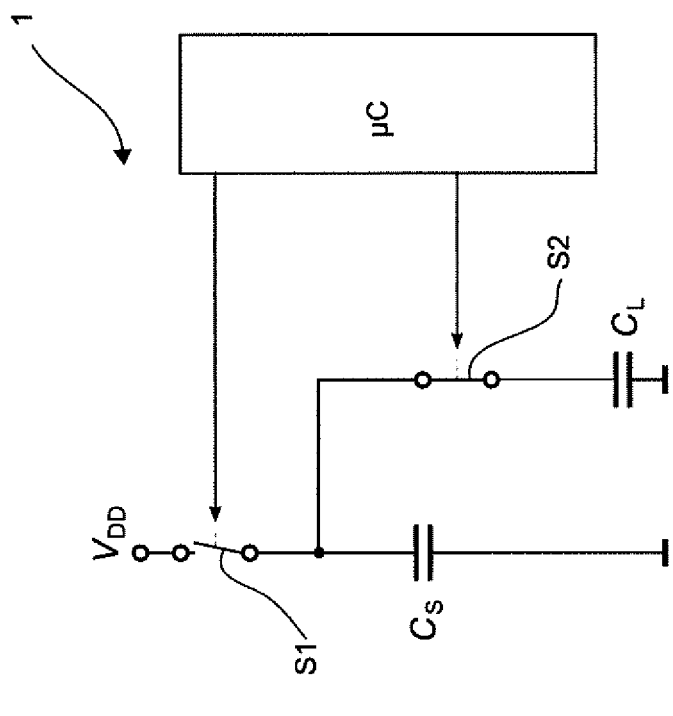
FIG. 3 shows a schematic representation of an exemplary embodiment of a capacitive proximity sensor arrangement, in which the inventive method is performed.
Figure 3:
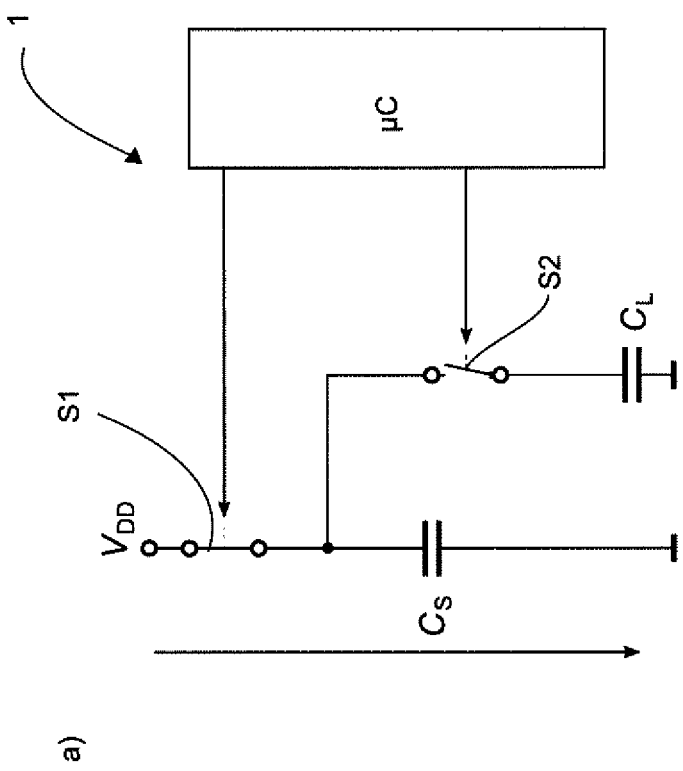

FIG. 3 shows a schematic representation of an exemplary embodiment of a capacitive proximity sensor arrangement, in which the inventive method is performed.

The proximity sensor arrangement 1 has a sensor electrode, which is symbolized by the capacity $C_S$. The sensor electrode in FIG. 3a is coupled to a charging circuit for voltage supply of $V_{DD}$. On the other hand, a series connection of $C_S$ with a storage circuit which has the storage capacity $C_L$ is also possible.

The switches $S_1$ und $S_2$ may be controlled by a microcontroller µC. In order to perform a transfer process, for example, in a first step, shown in FIG. 1a, the sensor electrode $C_S$ is coupled with the charging circuit for charging the sensor electrode with a charging voltage $V_{DD}$. Then, an opening of S1 and a closing of $S_2$ occurs (in this order) for an electric effective coupling of $C_S$ with $C_L$ in order to form a series connection of capacities. Thereafter a charge carrier compensation occurs between $C_S$ und $C_L$. This procedure is repeated until the predetermined number of transfer processes $n_{U,i}$ has been reached and the storage capacity is successively charged up to the desired operating point. Thus, a transfer cycle is complete.

It is clear that, beside the embodiments shown, many other embodiments are possible, in which the inventive method may be performed according to one of its embodiments.

The invention claimed is:

1. A method for evaluating a capacity value of a capacitive sensor electrode, wherein an evaluation process comprises the following steps:
    performing a charging process of a sensor electrode, wherein the sensor electrode is coupled, in a plurality of coupling and decoupling cycles, to a charging circuit for a coupling duration $t_K$ and is decoupled from the charging circuit for a decoupling duration $t_E$,
    wherein, in a coupling and decoupling cycle, during the coupling duration $t_K$ an at least partial charging of the sensor electrode takes place, and
    wherein, during the decoupling duration $t_E$ no charging of the sensor electrode takes place,
        evaluating a parameter depending on the capacity value of the sensor electrode,
    wherein a first charging pulse duration $t_{L,1}$, which is composed of a first coupling duration $t_{K,1}$ and a first decoupling duration $t_{E,1}$ with $t_{L,1}=t_{K,1}+t_{E,1}$, of a first coupling and decoupling cycle and a second charging pulse duration $t_{L,2}$, which is composed of a second coupling duration $t_{K,2}$ and a second decoupling duration $t_{E,2}$ with $t_{L,2}=t_{K,2}+t_{E,2}$, of a second coupling and decoupling cycle immediately following the first coupling and decoupling cycle, differ from each other by a first pulse duration difference $\Delta t_{L,1}$.

2. The method of claim 1, wherein during an evaluation process, the sensor electrode is subject to a number of coupling and decoupling cycles between 100 and 500.

3. The method of claim 1, wherein the first charging pulse duration and the second charging pulse duration is between 1.0 µs and 10.0 µs.

4. The method of claim 1, wherein the pulse duration difference $\Delta t_{L,1}$ is set by varying the decoupling duration by the value $t_{E,2}-t_{E,1}=\Delta t_{L,1}$ while maintaining the coupling duration of $t_{K,2}=t_{K,1}$.

5. The method of claim 1, wherein the pulse duration difference $\Delta t_{L,1}$ is set by varying the coupling duration by the value $t_{K,2}-t_{K,1}=\Delta t_{L,1}$ while maintaining the decoupling duration of $t_{E,2}=t_{E,1}$.

6. The method of claim 1, wherein the pulse duration difference $\Delta t_{L,1}$ is set by varying the coupling duration and by varying the decoupling duration, wherein the pulse duration difference $\Delta t_{L,1}$ has a value of $\Delta t_{L,1}=t_{K,2}-t_{K,1}+t_{E,2}-t_{E,1}$.

7. The method of claim 1, wherein during an evaluation process with N coupling and decoupling cycles, the charging pulse duration $t_{L,i}$ is varied subject to the condition that for $\Delta t_{L,i}=t_{L,i+1}-t_{L,i}$, $|\Delta t_{L,i}|/t_{L,i}>0.1$ for at least 50% of all i= 0 . . . N-1.

8. The method of claim 1, wherein a minimum charging pulse duration and a maximum charging pulse duration are preset, wherein a number of predetermined charging pulse duration values are provided, wherein two subsequent coupling and decoupling cycles are activated with two different values of the predetermined charging pulse duration values or
    a maximum charging frequency and a minimum charging frequency are preset, wherein a number of predetermined charging pulse frequencies is provided, wherein two subsequent coupling and decoupling cycles are activated with two different frequencies of the predetermined charging pulse frequencies.

9. The method of claim 8, wherein the predetermined charging pulse duration values are distributed at equal distances between the minimum charging pulse duration and the maximum charging pulse duration or
    the charging pulse frequencies are distributed at equal distances between the maximum charging frequency and the minimum charging frequency.

10. The method of claim 8, wherein
    the charging pulse durations or the charging pulse frequencies are controlled according to a predetermined sequence or
    the charging pulse durations or the charging pulse frequencies are controlled according to a random sequence.

11. The method of claim 8, wherein the minimum charging pulse duration and the maximum charging pulse duration is between 1.0 µs and 10.0 µs or
    the minimum charging frequency and the maximum charging frequency is between 1000 kHz and 100 kHz.

12. The method of claim 1, wherein
    in the coupling and decoupling cycle, during the coupling duration $t_K$, the sensor electrode is charged with charge carriers of the charging circuit with a predetermined charging voltage,
    wherein during the decoupling duration $t_E$, after the decoupling of the sensor electrode from the charging circuit, a coupling of the sensor electrode with a storage circuit with a storage capacity $C_L$ takes place, in order to transfer charge carriers stored in the sensor electrode to the storage capacity $C_L$,
    wherein, in the plurality of coupling and decoupling cycles, the sensor electrode in each coupling cycle during the coupling duration is again completely charged and the storage capacity $C_L$ during the decoupling duration is subsequently, not necessarily completely, charged with charge carriers, wherein the evaluation of the parameter depending on the capacity value of the sensor electrode comprises detecting, after a number of multiple coupling and decoupling cycles, preferably a predetermined number of coupling and decoupling cycles, a voltage on the storage capacity and using the same for determining the capacity of the sensor electrode or for determining a value, which depends on the capacity of the sensor electrode.

13. The method of claim 1, wherein in the coupling and decoupling cycle, during the coupling duration $t_K$, a coupling of the sensor electrode with a storage circuit with a storage capacity $C_L$ takes place, which is charged once before the first coupling and decoupling cycle at a predetermined charging voltage, for charge compensation between the storage capacity and the sensor electrode, wherein during the decoupling duration $t_E$, the sensor electrode is completely discharged, for example by temporary connection with a ground potential, wherein, in the multiple coupling and decoupling cycles, the sensor electrode in each coupling cycle is charged with charge of the storage capacity and thus the storage capacity is successively but not necessarily completely, discharged, wherein the evaluation of the parameter depending on the capacity value of the sensor electrode comprises detecting, after a number of multiple coupling and decoupling cycles, preferably a predetermined number of coupling and decoupling cycles, a voltage on the storage capacity and using the same for determining the capacity of the sensor electrode or for determining a value which is dependent on the capacity of the sensor electrode.

14. The method of claim 2, wherein the number of coupling cycles is between 150 and 250.

15. The method of claim 3, wherein the first charging pulse duration and the second charging pulse duration is between 2.5 µs and 4.0 µs.

16. The method of claim 1, wherein during an evaluation process with N coupling and decoupling cycles, the charging pulse duration $t_{L,i}$ is varied subject to the condition that for $\Delta t_{L,i} = t_{L,i+1} - t_{L,i}$, $|\Delta t_{L,i}|/t_{L,i} > 0.1$ for at least 80% of all $i = 0 \ldots N-1$.

17. The method of claim 1, wherein during an evaluation process with N coupling and decoupling cycles, the charging pulse duration $t_{L,i}$ is varied subject to the condition that for $\Delta t_{L,i} = t_{L,i+1} - t_{L,i}$, $|\Delta t_{L,i}|/t_{L,i} > 0.1$ for 100% of all $i = 0 \ldots N-1$.

18. The method of claim 11 wherein the minimum charging pulse duration and maximum charging pulse duration is between 1.5 µs and 5 µs or the minimum charging frequency and the maximum charging frequency is between 667 kHz and 200 kHz.

19. The method of claim 11 wherein the minimum charging pulse duration and maximum charging pulse duration is between 2.5 µs and 4.0 µs or the minimum charging frequency and the maximum charging frequency is between 400 kHz and 250 kHz.

* * * * *